United States Patent
Hueting et al.

(10) Patent No.: US 6,777,780 B2
(45) Date of Patent: Aug. 17, 2004

(54) TRENCH BIPOLAR TRANSISTOR

(75) Inventors: Raymond J. E. Hueting, Helmond (NL); Jan W. Slotboom, Eersel (NL); Petrus H. C. Magnee, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/205,555

(22) Filed: Jul. 25, 2002

(65) Prior Publication Data

US 2003/0030488 A1 Feb. 13, 2003

(30) Foreign Application Priority Data

Aug. 7, 2001 (GB) .............................................. 0119215

(51) Int. Cl.⁷ .......................................... H01L 27/082
(52) U.S. Cl. ...................... 257/565; 257/583; 257/584; 257/585; 257/592; 257/593
(58) Field of Search ................................ 257/262, 263, 257/273, 328–331, 339, 197, 198, 332–335, 583–585, 592–593, 565, 341

(56) References Cited

U.S. PATENT DOCUMENTS

| | | | |
|---|---|---|---|
| 5,326,711 A | 7/1994 | Malhi | 437/33 |
| 5,539,238 A | 7/1996 | Malhi | 257/510 |
| 5,828,101 A * | 10/1998 | Endo | 257/330 |
| 6,201,279 B1 | 3/2001 | Pfirsch | 257/333 |
| 2001/0013613 A1 | 8/2001 | Hurkx et al. | 257/260 |
| 2001/0048131 A1 | 12/2001 | Hurkx et al. | 257/329 |
| 2002/0158313 A1 * | 10/2002 | Takagi et al. | 257/593 |

FOREIGN PATENT DOCUMENTS

| | | | | |
|---|---|---|---|---|
| EP | 0126499 | | 11/1984 | H01L/21/76 |
| EP | 1073123 | * | 1/2001 | |
| EP | 1073123 A2 | | 1/2001 | H01L/29/06 |
| JP | 08078668 A | | 3/1996 | H01L/29/78 |

* cited by examiner

Primary Examiner—Steven Loke
Assistant Examiner—Donghee Kang
(74) Attorney, Agent, or Firm—Aaron Waxler (57) ABSTRACT

The invention relates to a trench bipolar transistor structure, having a base 7, emitter 9 and collector 4, the latter being divided into a higher doped region 3 and a lower doped drift region 5. An insulated gate 11 is provided to deplete the drift region 5 when the transistor is switched off. The gate 11 and/or doping levels in the drift region 5 are arranged to provide a substantially uniform electric field in the drift region in this state, to minimise breakdown. In particular, the gate 11 may be seminsulating and a voltage applied along the gate between connections 21,23.

14 Claims, 10 Drawing Sheets

TRENCH BIPOLAR TRANSISTOR

FIELD OF THE INVENTION

The invention relates to a vertical bipolar transistor, and particularly to a vertical bipolar transistor suitable for use at high frequencies.

BACKGROUND OF THE INVENTION

Bipolar transistors are used in a number of applications, including in high-voltage radio frequency devices. The design of such structures is a trade-off between a number of factors. One factor is the breakdown voltage between the collector and the base or emitter, i.e. the maximum voltage that may be applied between the collector and the base or emitter when applying a reverse potential to the collector without causing breakdown. Another factor is the cutoff frequency of operation. It would be desirable to increase the values is of both of these parameters.

However, it is well known in the art that in general the product of the cutoff frequency $f_t$ and the breakdown voltage between the collector and the emitter has a maximum known as the Johnson limit. This product is accordingly an important parameter for bipolar transistors. Since the product has a maximum, it is not normally possible to increase one of these parameters without reducing the other.

An exception is known to the Johnson limit at very high frequencies. Non-local avalanche effects in the base-collector space charge region can allow the Johnson limit to be exceeded at the very highest radio frequencies.

However, it would be useful to be able to design transistors for which the value of the threshold frequency and breakdown voltage product exceeds the Johnson limit over a broad radio frequency range.

SUMMARY OF THE INVENTION

According to the invention there is provided a bipolar transistor structure, comprising: a collector including a higher doped collector region of semiconductor material of a first conductivity type doped to a first concentration; an emitter region of semiconductor material of the first conductivity type; a base region of semiconductor material of a second conductivity type opposite to the first conductivity type between the emitter region and the collector; the collector further including a lower doped drift region extending between the higher doped collector region and the base region, the drift region being of the first conductivity type and doped to a second concentration lower than the first concentration; a trench extending adjacent to the drift region; and a gate within the trench insulated from the drift region for controlling the drift region to be depleted of carriers in a voltage blocking mode of operation.

The drift region in the collector is of lower doping concentration than the higher doped region of the collector so that the drift region may be depleted of carriers. Using the gate in the trench the drift region can be depleted even with a higher doping in the drift region than would otherwise be possible. This allows the product of the threshold frequency and the breakdown voltage to be increased as compared with prior art structures. In embodiments of the invention, the Johnson limit may be exceeded.

Conveniently, the structure may be a vertical structure formed on a semiconductor body having opposed first and second faces. The emitter region may be connected to the first face and the collector region to the second face. The trench may extend substantially perpendicularly to the first face through the emitter and base regions to the drift region.

In alternative embodiments, a lateral structure may be provided, for example using an insulated buried layer as the gate.

The gate may be separated from the drift region by a gate insulating layer on the sidewalls of the trench.

The structure is also typically easier to manufacture than structures involving multiple layers in the drift region.

The collector region may include a semiconductor substrate or body or a layer or region formed on a substrate. The trench may extend through the emitter, base and drift regions.

The invention is of particular application to high frequency devices. Such devices, may be for example heterostructure bipolar transistors. The invention can also be used for low frequency devices.

The gate may be of a semi-insulating material, and the structure may further comprise a first gate connection at the end of the gate adjacent to the boundary between the drift region and the base region and a second gate connection at the boundary between the drift region and the higher doped collector region. This allows a uniform field to be applied along the gate thereby providing a uniform field in the drift region to minimises the risk of breakdown at low voltages. The uniform field is achieved without complex doping profiles in the drift region being necessary.

The contact at the end adjacent to the base may be electrically connected to the emitter (or base). Thus, the first gate connection may be a gate contact in electrical connection with a base contact contacting the base or an emitter contact contacting the emitter. In alternative embodiments, there may be a separate connection to the gate to allow the voltage across the gate to be controlled independently of the voltage on the emitter.

The second gate connection may be a direct connection between the end of the drift control gate adjacent to the higher doped region of the collector and the higher doped region of the collector. Alternatively, the second gate connection may be a further contact so that the voltage applied along the gate can be controlled independently.

Alternative embodiments replace the semi-insulating gate with a p-i-n diode having voltage dropped across the intrinsic (i) region to very similar effect.

Alternatively, the gate may be conducting and a uniform field in the drift region may be provided by a suitable graded doping profile in the drift region. In this particular embodiment the gate is isolated from the highly doped collector region.

Other advantageous technical features of the present invention are set out in the attached dependent claims.

In another aspect the invention also relates to a method of manufacturing the bipolar transistor described above.

BRIEF DESCRIPTION OF THE DRAWINGS

For a better understanding of the invention, embodiments will now be described, purely by way of example, with reference to the accompanying drawings in which.

It should be noted that all of the Figures are diagrammatic and not to scale: the relative dimensions of the parts have been exaggerated and reduced in size for clarity and convenience. Like reference numbers are generally used to refer to corresponding or similar features.

DETAILED DESCRIPTION OF THE INVENTION

Figure 1:
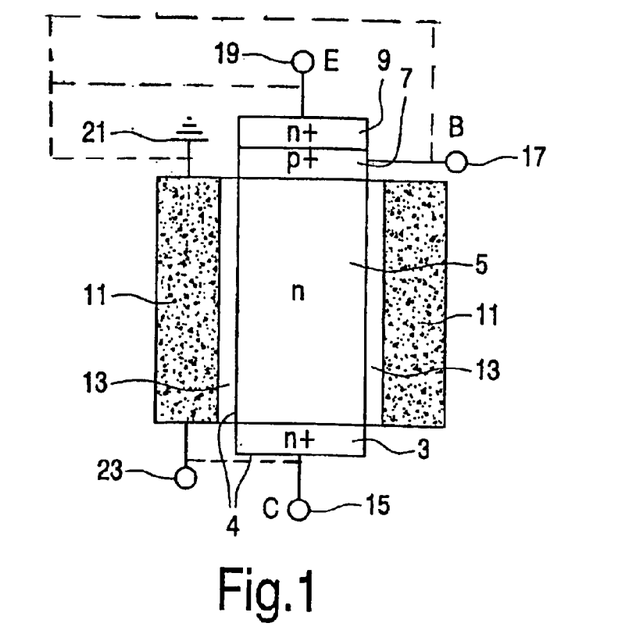
FIG. 1 shows a first schematic embodiment of a bipolar transistor structure according to the invention.

Referring to FIG. 1, a vertical bipolar transistor according to a first embodiment of the invention has a collector 4 including a higher doped collector region 3 and a lower doped drift region 5, a base region 7 above the drift region 5 and an emitter region 9 above the base region. The regions are of semiconductor material; the base region 7 is of opposite conductivity type to the emitter 9 and collector 3,4,5 regions. In the example, the bipolar transistor is an NPN transistor with a p-type base 7 and an n-type emitter 9 and collector 4, but the invention is equally applicable to PNP transistors. The drift region 5 is more lightly doped than the higher doped collector 3, base 7 and emitter 9 regions.

The various transistor regions may be formed in a known manner, for example in crystalline silicon, III–V semiconductor, Si—Ge layers or other alloys, II–VI semiconductors, Nitride containing layers, etc.

In contrast to a conventional vertical bipolar transistor structure a semi-insulating gate 11 is provided at either side of the drift region insulated from the drift region 5 by a thin insulating layer 13. The gate electrode is of semi-insulating material so that it can support a voltage along it. For example, semi-insulating polysilicon may be used. As will be apparent, a variety of different semi-insulating materials may be used to the same effect.

The insulating layer may be formed of silicon dioxide, silicon nitride, or combinations of these or other layers as will be apparent to the skilled person.

Collector 15, base 17 and emitter 19 contacts are provided connecting to the base 7, collector 3 and emitter 9 respectively. A first gate connection is provided in the form of a first gate contact 21 is provided at the upper surface of the gate electrode 11. The lower end of the gate electrode 11 is connected to a second gate contact 23.

In use, the transistor may be controlled to be in a blocking mode of operation in which voltage is dropped between base and collector with only a very small current passing through the base and collector. In this mode, the transistor can be said to be switched off. As well as voltage across base and collector, voltage is also supplied across the gate contacts 21, 23 and is dropped along the gate 11. This creates a uniform vertical electric field within the gate electrode, which applies a uniform electric field to the drift region 5. Conveniently, as shown in phantom in FIG. 1, the upper gate contact 21 may be connected to the emitter contact 19 (or to the base contact 17), and the lower gate contact 23 to the collector contact 15, though in alternate embodiments separate contacts may be provided. The uniform electric field is beneficial in keeping the collector-base breakdown voltage as high as possible.

The structure shown allows high frequency operation, and especially allows the increase of the breakdown voltage with less degrading effect on the cutoff frequency than otherwise possible. Thus, the maximum possible product of the threshold frequency and the collector base breakdown voltage may exceed the Johnson limit.

Although FIG. 1 shows only a single emitter and collector surrounded by the gate, it will be appreciated that in practice an array of such structures may be provided, connected in parallel to increase the current handling capability of the device. For example, in embodiments an array of mesas each containing a drift region 5, a base 7 and an emitter 9 and surrounded by gates 11 may be provided.

By ensuring depletion of the drift region when applying a reverse voltage to the collector and a substantially linear voltage gradient in the drift region provided, in this state, by the gate, regions of local high electric field can be avoided thereby increasing the breakdown voltage.

The depletion of the drift region has the benefit that the doping in the drift region can be higher than it would need to be without gates to deplete the drift region when the transistor is turned off. This postpones the Kirk effect in the transistor and increases the maximum possible current density and consequently increases the switching frequency. Moreover, it reduces the resistance of the drift region when the device is switched on and increases the maximum possible current density.

The inventors are not aware of prior examples of using an insulated gate to deplete a drift region in a bipolar transistor structure.

The transistor type illustrated is a conventional bipolar transistor but the invention is also of application in a number of other types of transistor. For example, the invention is of particular utility in transistors for use at high frequency. At radio frequencies, heterostructure bipolar transistors (HBTs) may be used, thus the invention is of particular application to HBTs. The ideas of the invention may also be of use in a number of other types of structure, including for example an insulated gate bipolar transistor, or other similar structures.

The structure shown in FIG. 1 is a vertical structure. This term is used in the present specification to refer to a device in which the current flow is through the device, generally perpendicular to the faces of the substrate, rather than laterally parallel to the substrate. Often, a vertical device is one in which the collector and emitter contacts are on opposite faces. The invention is also applicable in a lateral structure, for which see below with reference to FIG. 15.

Figure 2:
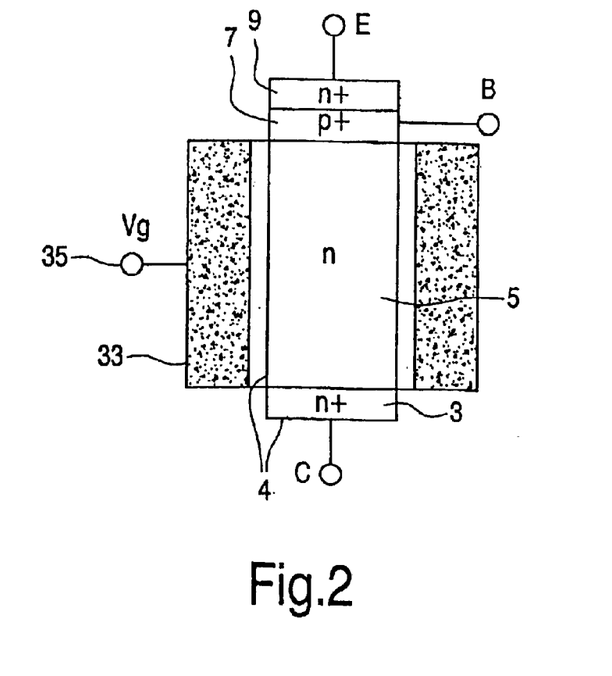
FIG. 2 shows a second schematic embodiment of a bipolar transistor structure according to the invention.

It will be appreciated that the arrangement of FIG. 1 is not the only arrangement that allows depletion of the drift region when the device is turned off, together with a substantially uniform field in the drift region. An alternative approach, shown in FIG. 2, uses a conductive gate 33 with a separate gate contact 35. In this arrangement however, the doping in the drift region 5 is selected to give a substantially uniform field with a constant voltage on the gate 33. This is achieved by a graded doping profile, with the doping concentration higher near the collector electrode than near the base electrode.

Figure 3:
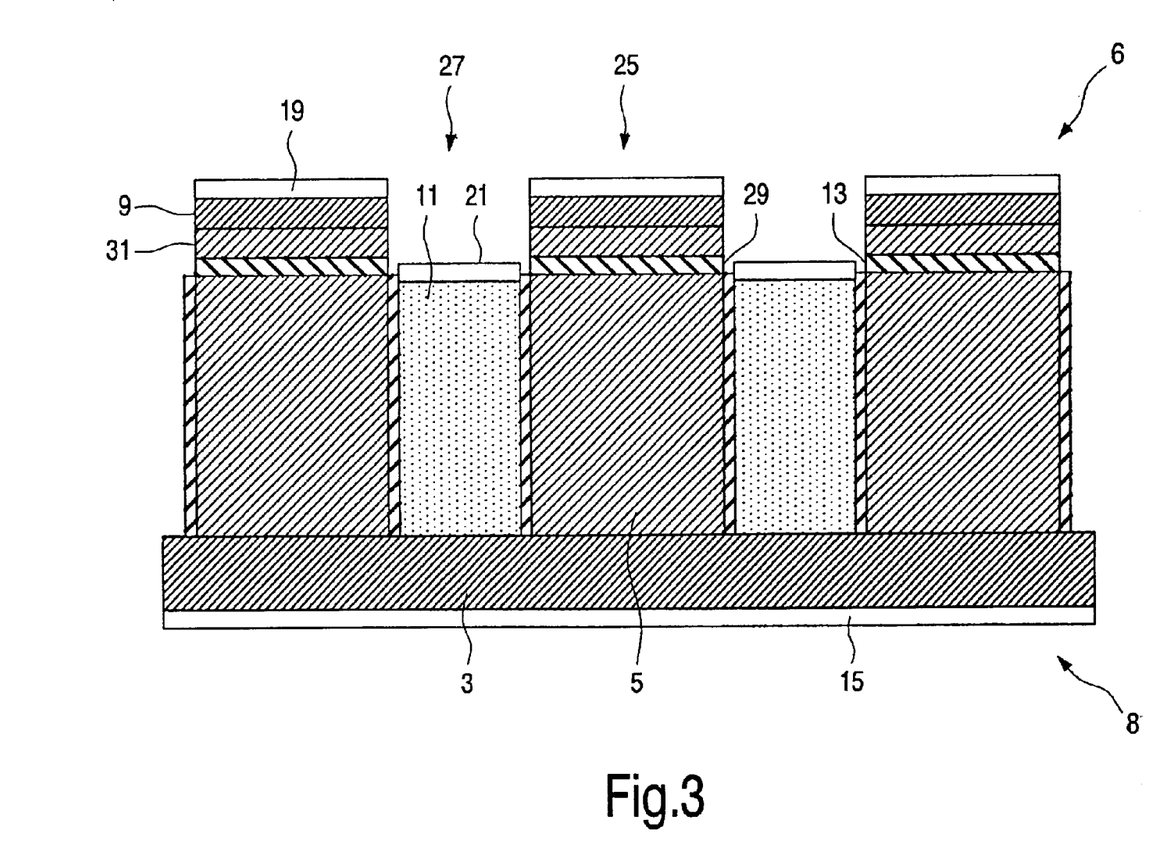
FIG. 3 shows a third embodiment of a bipolar transistor structure according to the invention.

Referring to FIG. 3, in a specific embodiment of the invention the structure is formed on a $n^+$ semiconductor body or substrate 3 doped with a doping concentration $2\times10^{19}$ cm$^{-3}$. The body 3 has opposed front 6 and rear 8 faces. A rear contact 15 connects to the substrate 3, which acts as the higher doped collector region 3 of the bipolar transistor.

The remaining layers forming the transistor proper are formed on the substrate as a plurality of mesas 25 each of width 0.3 μm each mesa being surrounded by trench 27 separated from the mesa 25 by a thin silicon dioxide insulating layer 13 of thickness 10 nm.

A 3.5 μm thick drift region 5 doped n-type with a doping concentration $10^{17}$cm$^{-3}$ is provided above the higher doped collector substrate 3. A thin SiGe layer 29 having a 20% germanium percentage is formed over the drift region 5. The thin SiGe layer 29 acts as the base, and is doped p-type with a doping concentration of $3\times10^{19}$ cm$^{-3}$. There is an emitter-base space charge region 31 having a doping of $5\times10^{17}$ cm$^{-3}$ over the base 29. The emitter region 9 is located over the emitter-base space charge region 31 and has a doping of $2\times10^{21}$ cm$^{-3}$. An emitter contact 19 is provided on the emitter 9. It will be appreciated that these specific dimensions and doping concentrations may be varied.

The trenches 27 contain a semi-insulating polysilicon (SIPOS) gate 11. A contact 21 is formed on the top of the SIPOS gate 11 to form the first gate connection. The top of the SIPOS gate 11 is placed adjacent to the boundary between the base 7 and drift region 5 to avoid an inversion layer in the base adjacent to the gate 11 and to avoid field crowding at the corner of the junction. The top contact 21 is connected to the emitter contact 19. The base contact to the base 29 is provided laterally of the mesa.

It will be noted that the bottom of the SIPOS gate 11 is connected directly to the collector to form the second gate connection at the opposite end of the gate to the first gate connection.

Figure 4:
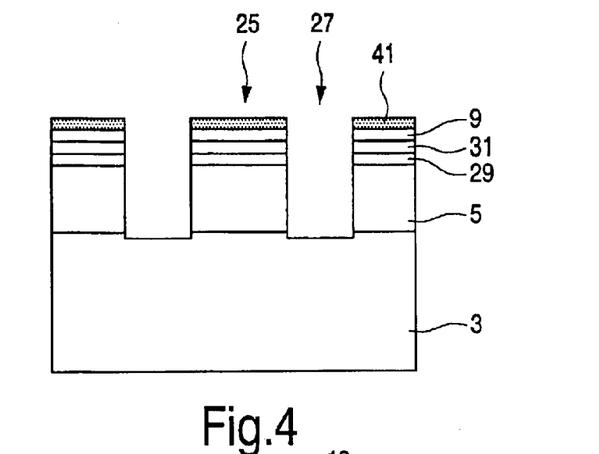
FIGS. 4 to 6 illustrate steps used to manufacture the bipolar transistor structure of FIG. 3.
Figure 5:
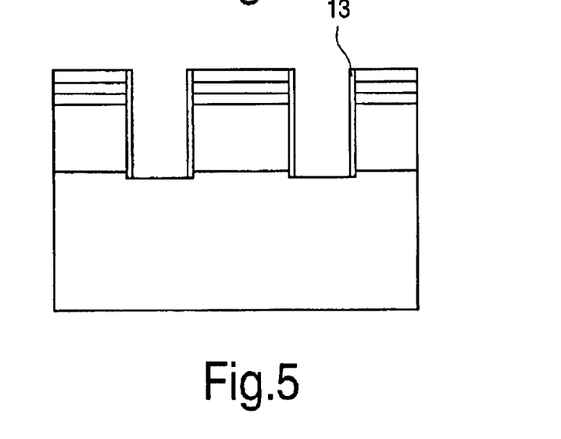
Figure 6:
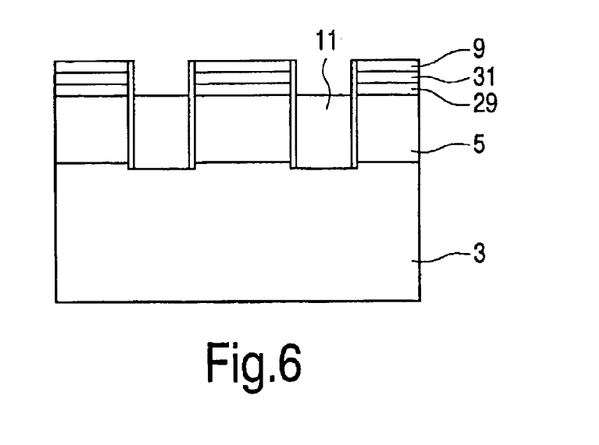

A method of manufacture of this structure is illustrated with reference to FIGS. 4 to 6.

The initial stages are exactly the same as the stages used to form a heterostructure bipolar transistor having a drift region, and so will already be familiar to the skilled person in this field. An epilayer 5 to form the drift region is grown on n+ doped substrate 3 forming the collector region. The epilayer is doped n-type with a doping concentration of $10^{17}$cm$^{-3}$.

Next, a thin SiGe layer 29 is grown to form the base, followed by a emitter-base space charge layer 31, and an emitter layer 9. It should be noted that as an alternative the emitter layer 9 may be grown later.

Next, a photoresist mask 41 is deposited and patterned. A plurality of trenches 27 are then etched through the epilayer 5 as far as the collector substrate 3 using an anisotropic etch process. In the specific example, the process used is a dry etch process. It is not necessary to stop the etch exactly at the top of the collector substrate 3, so a slight overetch may be performed if required, resulting in the structure of FIG. 4.

The photoresist 41 is stripped, and a gate insulation layer 13 formed to cover the structure, including the walls of the trench. In the specific embodiment the gate insulation layer 13 is a thermal oxidation layer formed by thermal oxidation in a suitable atmosphere. The thermal oxide layer 13 is then etched using an anisotropic spacer etch process to remain only on the sidewalls of the trenches 27 (FIG. 5). This etch process is not used to form alternative embodiments with a gate isolated from the collector.

Chemical vapour deposition is then used to deposit semi insulating polysilicon (SIPOS) 11 in accordance with known techniques, to fill the trenches. An etch back process is then used to clear any polysilicon from above the epilayer resulting in the structure and to etch the polysilicon 11 to the level of the base 29 shown in FIG. 6.

The final step is then to form contacts 15,19,21 by masking with photoresist, depositing contact metal, and removing the photoresist as is known to result in the structure of FIG. 3 of the application.

As an alternative, especially for transistors that do not exceed 30 GHz, the base and collector may be implanted before or after trench formation.

This method of manufacture is considerably easier to perform than many alternatives. In particular, there is no need for many layers one on top of the other with different doping levels, which would be very hard to manufacture.

Figures 7, 8:
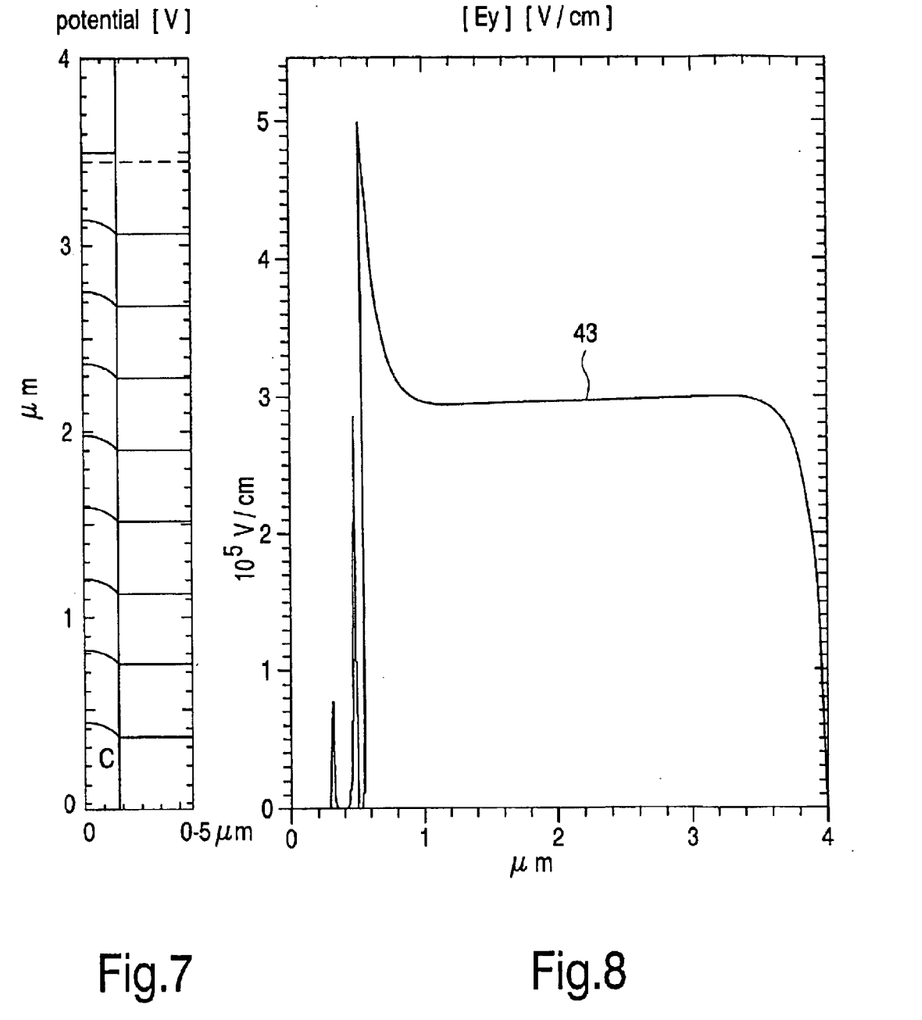
FIG. 7 shows the equal potential lines in the structure of FIG. 3.
FIG. 8 shows the vertical field in the drift region of the structure of FIG. 3.

The device according to FIG. 3 was modelled. FIG. 7 illustrates the potential contours in the device of FIG. 3 with a voltage of 95 volts applied between the base and collector—this being the breakdown limit of this structure. The left hand edge of the Figure corresponds to the centre of the mesa 25; the graph is symmetric about this axis and accordingly the left half of the mesa 25 is not shown. As can be seen, the contours are equally spaced in the gate region 11, whereas in the drift region 5 there is some horizontal field, and the contours are again equally spaced. This corresponds to a substantially constant vertical electric field in the drift region, except for near the base-collector junction. The vertical field (curve 43) as a function of distance is illustrated in FIG. 8. Except for near the base-collector junction, the vertical electric field is substantially constant in the drift region.

Figure 9:
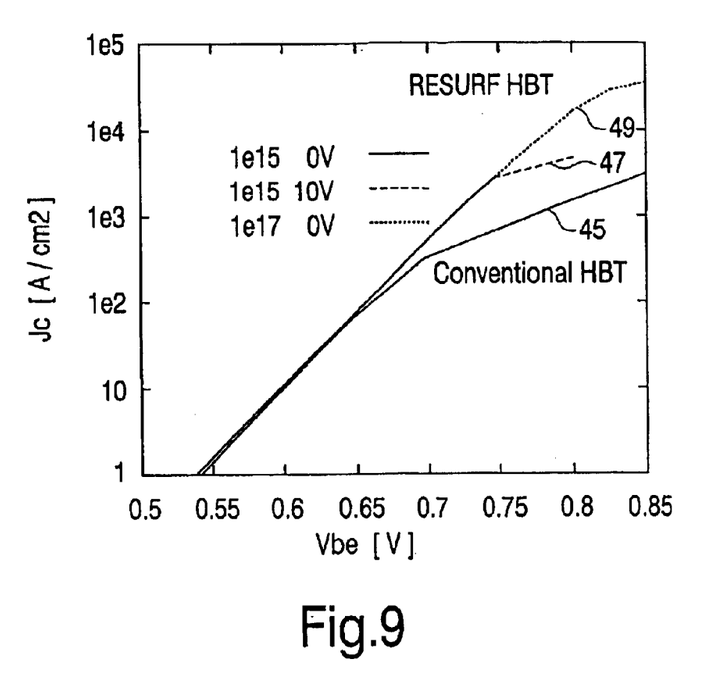
FIG. 9 shows the improved current density in a device according to the invention.

The collector current of this structure has been simulated as a function of base-emitter voltage ($V_{be}$) and compared with that of a conventional structure (FIG. 9). The conventional hetero-structure bipolar transistor structure for comparison has a similar collector 3, base 29, emitter-base space charge region 31 and emitter 9. However, the conventional structure differs in two regards. Firstly, there are no trenches or gates, and secondly the doping in the drift region is only $10^{15}$cm$^{-3}$ not $10^{17}$cm$^{-3}$. The device used for comparison also had a drift length of 3.8 μm as the device according to the embodiment of the invention has a drift length of 3.5 μm. The resulting comparison device has a breakdown voltage of around 95 V, similar to that of the embodiment of FIG. 3.

As can be seen from FIG. 9, the collector current density of the conventional hetero-structure bipolar transistor (curve 45) starts to behave non-linearly in base-emitter voltage at 500 A/cm$^2$ which roughly corresponds with the Kirk limit. This can be raised somewhat by supplying 10 volts to the collector contact (curve 47).

However, for the device according to the invention (curve 49) the current density can be much higher which is due to the increase in doping possible in the drift region 5. The reason that higher doping is possible is that the device can be turned off by depletion from the trench regions 11. Another effect which increases the maximum collector current density is the horizontal field present in the drift region 5 which forces the holes out of the drift region. This latter effect is however less important in this specific embodiment.

Figure 10:
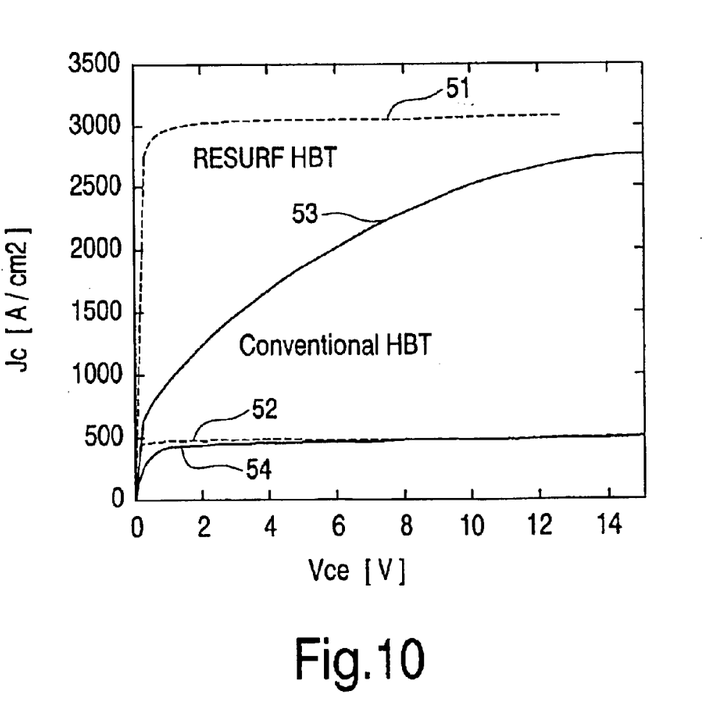
FIG. 10 shows the improved performance of the device of FIG. 3.

FIG. 10 illustrates the collector current density as a function of collector-emitter voltage. Here again, the greatly improved performance of the device shown in FIG. 3 according to the invention (curves 51,52) compared with a conventional device (curves 53,54) may be seen. The lower graphs (52, 54) are the results of a base-emitter voltage of 0.7V, the upper graphs (51, 53) of a base-emitter voltage of 0.75V.

Figure 11:
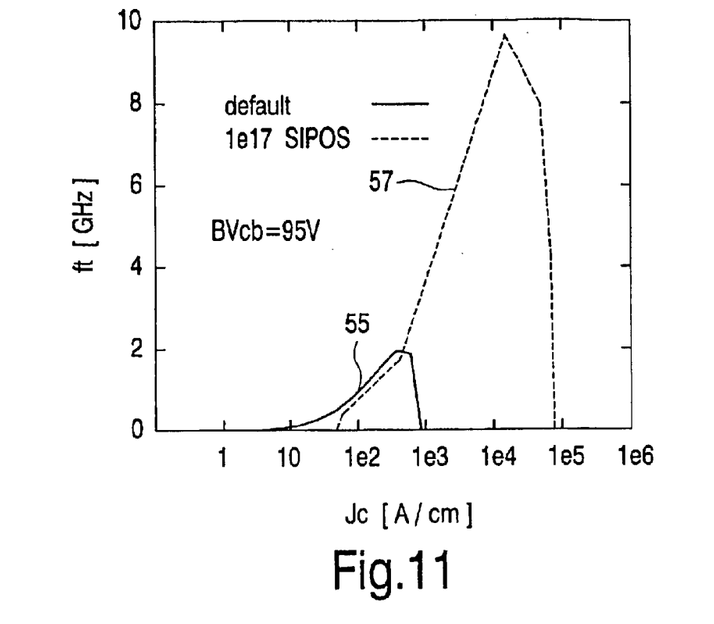
FIG. 11 shows the improved high frequency performance of the device of FIG. 3.

Calculations of the cutoff frequency have been performed with the upper contact 21 of the SIPOS layer connected to the emitter (FIG. 11). The maximum cut off frequency for a conventional transistor (curve 55) is 2 GHz, while that of the device according to the invention (curve 57) is 10 GHz. These calculations have been performed for collector-base voltages of 0 volts. The maximum cut off frequency for the new structure is reached at higher current densities because the Kirk effect only kicks in at high densities. Hence, the invention allows the conventional maximum product of threshold frequency and collector base breakdown voltage to be exceeded since the breakdown voltages of both the conventional and the new structure are substantially the same (95 volts).

Figure 12:
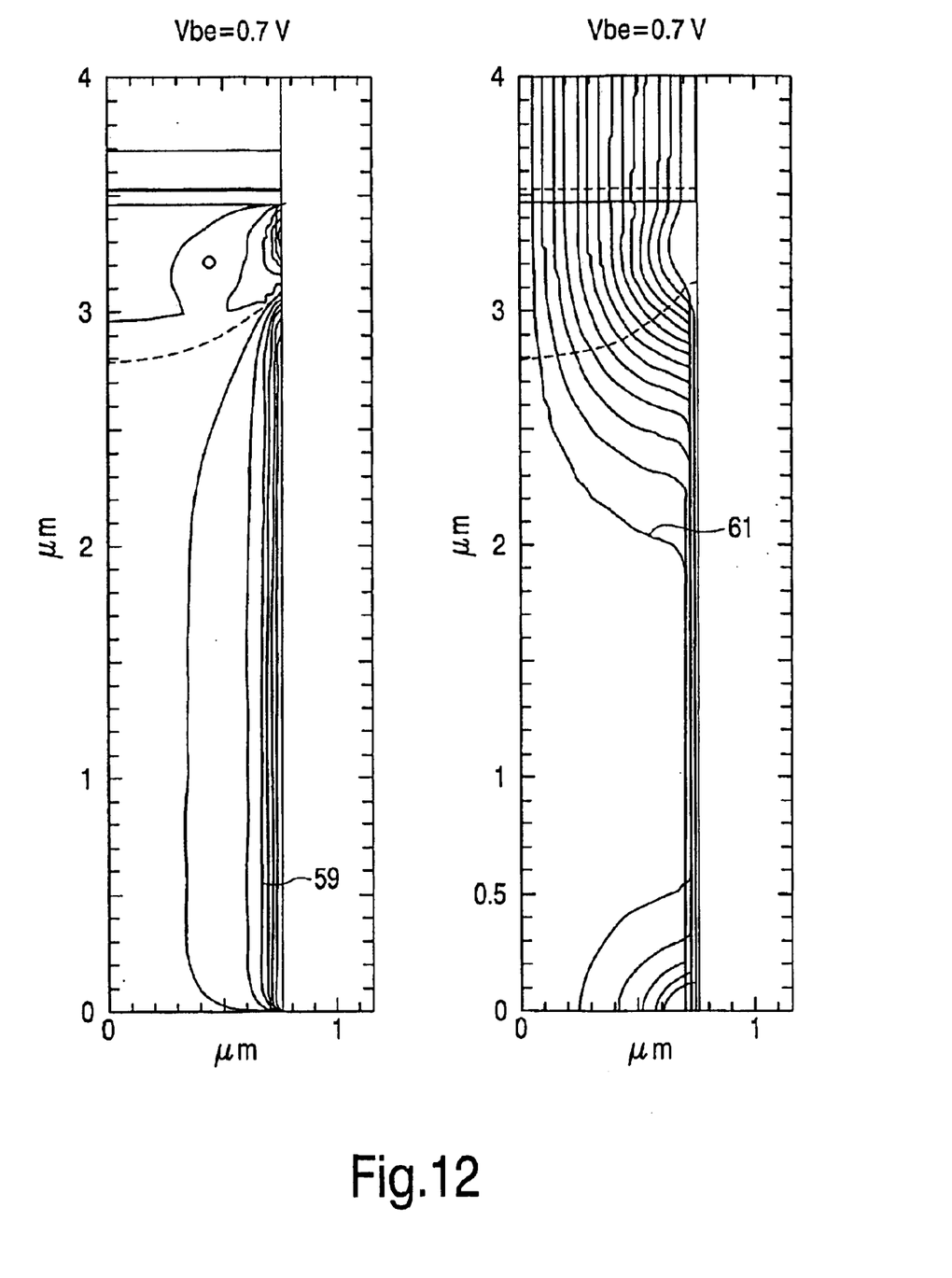
FIG. 12 shows the electron concentration and current flow in the device of FIG. 3.

FIG. 12 shows contour plots of the electron concentration 59 and electron current flow 61 for the device according to the invention. As in FIG. 7, the left hand edge of the graph represents the centre of the drift region 5. The current flows inhomogeneously through the drift region, as illustrated.

Figure 13:
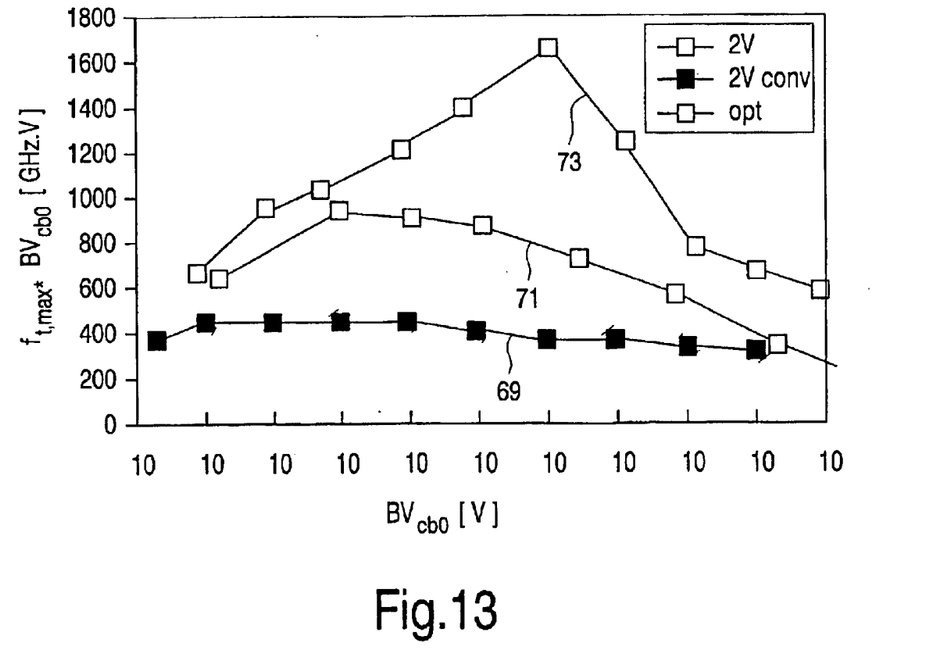
FIG. 13 shows the cutoff-frequency breakdown voltage product for the device of FIG. 3, an alternative device and a comparative example.

In FIG. 13, the maximum available product of cut-off frequency with collector-base breakdown voltage is plotted as a function of collector-base breakdown voltage for a conventional HBT (curve 69), a device with the same low drift concentration as the conventional HBT but including a trench gate according to the invention (curve 71) and an optimised HBT formed with the structure of the embodiment of FIG. 3 (curve 73). As can be seen, the use of the trench field gates to control the drift region gives much better results. Indeed, these values are record values for silicon and compete with the highest values available in III–V devices. A conventional Si(Ge) HBT bipolar device may have a maximum cut-off frequency of about 85 GHz for a breakdown voltage of 2V. These values may be exceeded by the invention, which may provide, for example, a 10V breakdown voltage with a 50 GHz cut-off.

Figure 14:
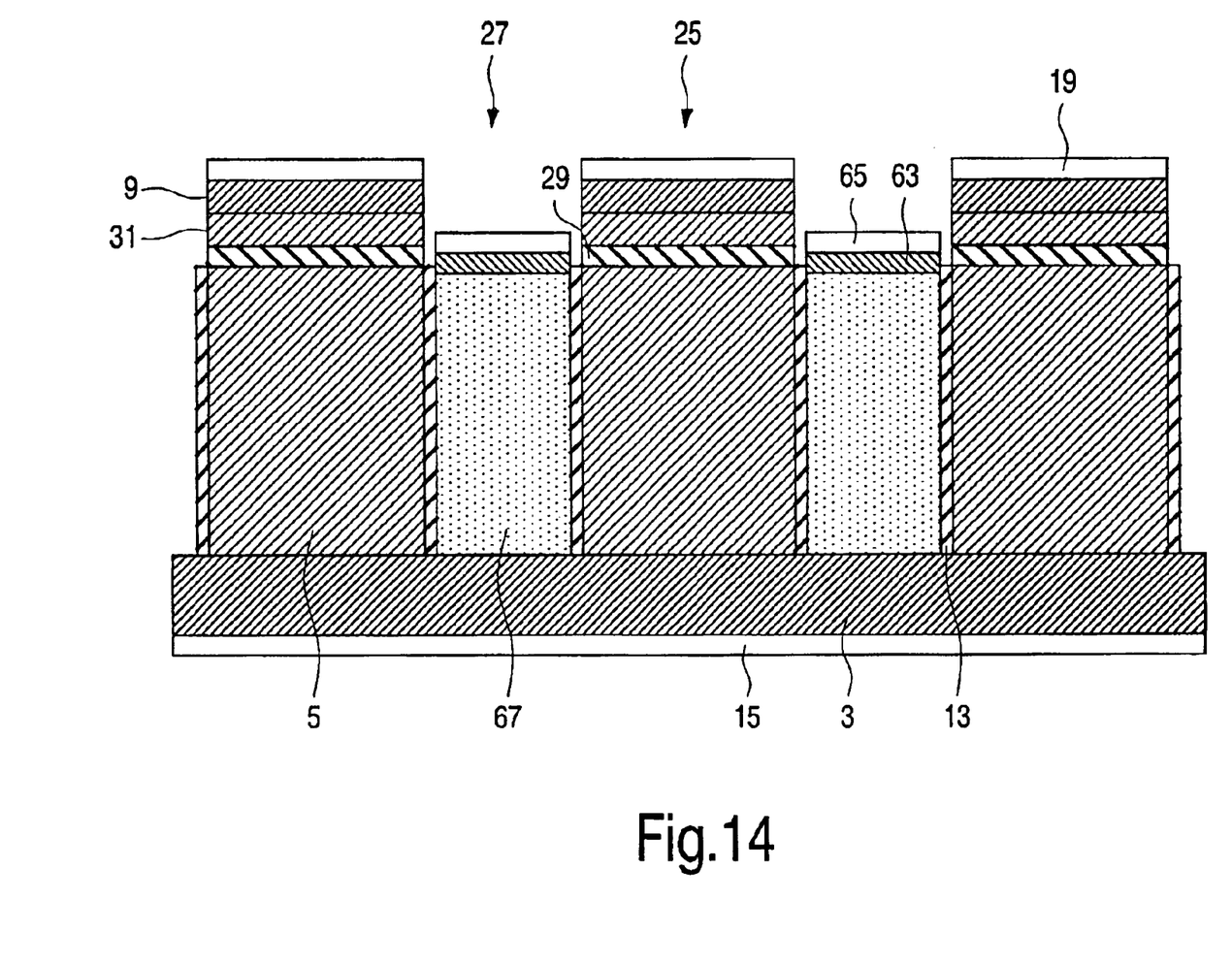
FIG. 14 shows a fourth embodiment of the invention.

A further embodiment of the invention is shown in FIG. 14, in which the semi insulating gate 11 of the embodiment of FIG. 3 is replaced with a p-i-n diode. The p-i-n diode has an p-layer 63, an intrinsic layer 67 and an n-type layer formed by the collector 3 and can carry a uniform field across the intrinsic layer with similar results to the uniform electric field produced in the embodiment of FIG. 3. A contact 65 connects to the p-layer 63. The structure of the FIG. 14 embodiment is particularly compatible with existing BiCMOS processes.

Figure 15:
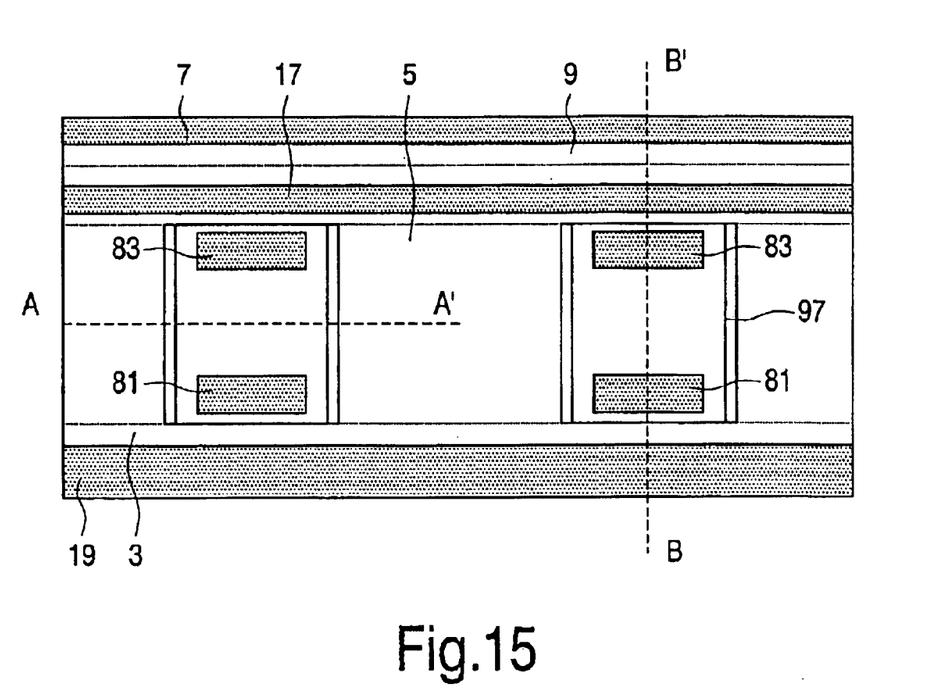
FIG. 15 shows a top view of a fifth, schematic, embodiment of the invention.
Figure 16:
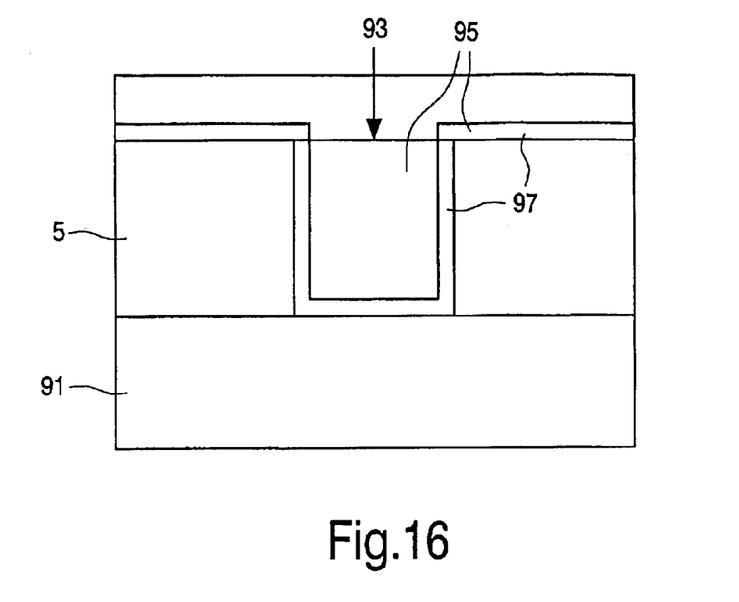
FIG. 16 shows a lateral section through the embodiment of FIG. 15.
Figure 17:
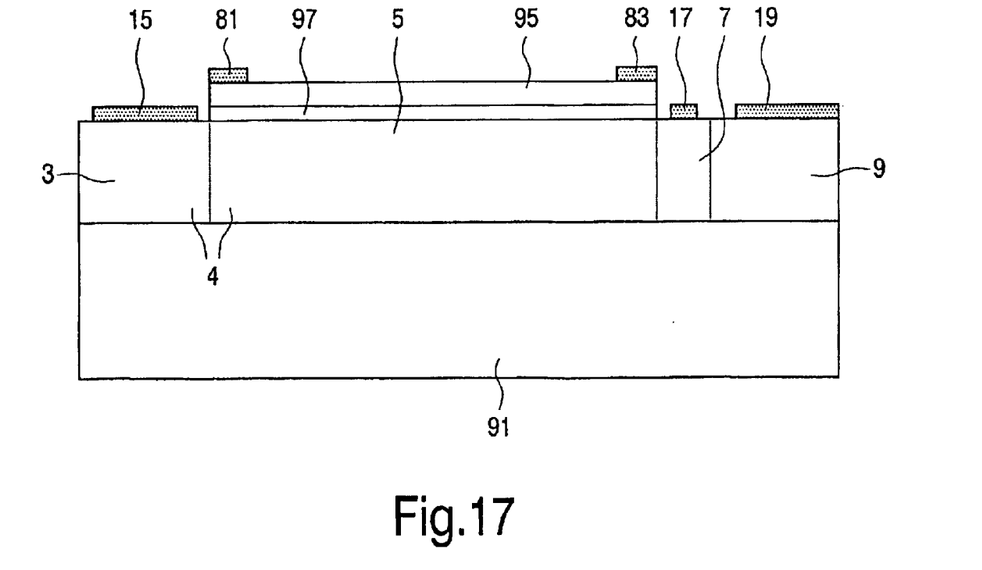
FIG. 17 shows a longitudinal section through the embodiment of FIG. 15.

In a fifth embodiment of the invention, illustrated schematically in FIGS. 15, 16, and 17, a lateral structure is provided. FIG. 15 shows a top view of the structure, and FIGS. 16 and 17 sections along A—A and B—B respectively. In this embodiment, an insulating substrate 91, for example a glass substrate or a semiconductor substrate with an insulating layer deposited over it is provided and the transistor structure is formed in semiconductor layers over the substrate.

Referring to FIGS. 16 and 17, the structure includes, arranged along longitudinal axis B—B, a collector 4, a base region 7 and an emitter region 9. The collector region 4 is divided into a higher doped region 3 and a lower doped drift region 5 extending longitudinally between the higher doped region 3 and the base 7. It will be noted that the direction B—B is referred to as the longitudinal axis and direction A—A as the lateral axis since the transistor current flow is along B—B.

A seminsulating gate electrode 95 insulated from the drift region 5 by gate insulation 97 is provided above the drift region 5. Contacts 81,83 are provided on the gate electrode 95 at longitudinal ends of the gate electrode 95. These contacts 81,83 are used for applying a voltage-along the gate electrode 95 in like manner to the vertical embodiments.

Referring to FIGS. 15 and 17, the semiinsulating gate electrode 95 extends laterally around the drift region 5 in trenches 93 arranged on either side of the drift region. The gate oxide layer 97 extends on the sidewall and base of the trench to insulate the gate electrode from the drift region 5.

In use, in a voltage blocking mode of operation voltage is supplied along the gate contacts 81, 83 to deplete the drift region 5 and also to maintain a substantially uniform longitudinal electric field in the drift region to improve the collector-base breakdown voltage, in a like manner to the vertical embodiments described above.

The lateral structure is relatively easy to manufacture. The gates are in insulated trenches.

It should be noted that the invention is not limited to the example described above and in particular may be used for any heterostructure bipolar transistor or indeed other (bipolar) transistor structure.

The specific sizes and materials of the specific embodiments described above may be varied, as will be appreciated by the skilled person.

Moreover, the invention is not limited to n-type transistors and can be used also for PNP transistors. Also, the device is not limited to silicon structures and can also be used in germanium, germanium silicon, III–V, III-N and SiC bipolar devices.

In particular, the use of a SiGe HBT structure is useful for devices operating at voltages lower than 30V, especially below 10V. For higher voltage devices, a more conventional Si bipolar junction transistor design may be used. Accordingly, for a preferred arrangement having a breakdown voltage of 95V the Si—Ge-base layer of the embodiment illustrated in FIG. 3 may be replaced with a Si layer having a lower doping concentration of typically about $10^{18}$ cm$^{-3}$.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

What is claimed is:

1. A bipolar transistor structure, comprising:
   a collector including a higher doped collector region of semiconductor material of a first conductivity type doped to a first concentration;
   an emitter region of semiconductor material of the first conductivity type;
   a base region of semiconductor material of a second conductivity type opposite to the first conductivity type between the emitter region and the collector;
   the collector further including a lower doped drift region extending between and directly contacting the higher doped collector region and the base region, the drift region being of the first conductivity type and doped to a second concentration lower than the first concentration;
   a trench extending adjacent to the drift region; and
   a gate within the trench insulated from the drift region for controlling the drift region to be depleted of carriers in a voltage blocking mode of operation,
   wherein, in use with a reverse potential applied between the base and the highly doped collector regions, an electric field in the drift region is substantially uniform.

2. A bipolar transistor structure according to claim 1 wherein the structure is a vertical structure formed on a semiconductor body having opposed first and second faces, the emitter region being electrically connected at the first face and the collector region at the opposite second face, and the trench extends substantially perpendicularly to the first face of the semiconductor body through the emitter, base and drift regions.

3. A bipolar transistor structure according to claim 1 wherein the gate extends vertically in the trench adjacent to the drift region and is separated from the drift region by a gate insulating layer on the sidewalls of the trench.

4. A bipolar transistor structure according to claim 1 wherein the product of the cutoff frequency and the collector-base breakdown voltage exceeds the Johnson limit for a conventional bipolar transistor.

5. A bipolar transistor structure according to claim 1 wherein the gate is of a semi-insulating material, further comprising a first gate connection at one end of the gate adjacent to the boundary between the drift region and the base region and a second gate connection at the other end of the gate adjacent to the boundary between the drift region and the higher doped collector region so that a voltage can be applied between the gate connections to generate a substantially uniform electric field in the gate and accordingly in the adjacent drift region.

6. A bipolar transistor structure according to claim 5, wherein the first gate connection is a gate contact in electrical connection with a base contact contacting the base or an emitter contact contacting the emitter.

7. A bipolar transistor structure according to claim 5 wherein the second gate connection is a direct connection between the end of the drift control gate adjacent to the higher doped region of the collector and the higher doped region of the collector.

8. A bipolar transistor structure according to claim 1 wherein the gate formed in the trench includes an intrinsic semiconductor layer in the trench in contact with the highly doped collector region of first conductivity type, and a semiconductor layer of second conductivity type is provided adjacent to the intrinsic semiconductor layer and on the opposite side of the intrinsic semiconductor layer to the higher doped collector region.

9. A bipolar transistor structure according to claim 1 wherein the gate is of conductive material.

10. A bipolar transistor structure according to claim 9 wherein the base layer is a Si-Ge layer.

11. A bipolar transistor structure according to claim 1 wherein the base is formed of a different material to the collector or emitter whereby the structure forms a heterostructure bipolar transistor.

12. A bipolar transistor structure according to claim 1 wherein the structure is a lateral structure in which the higher doped and drift collector regions, the base region and the emitter region are arranged longitudinally along a substrate, and wherein the gate is provided at least partially in a insulated trench extending longitudinally along and adjacent to the drift region.

13. A bipolar transistor structure, comprising:
   a collector including a higher doped collector region of semiconductor material of a first conductivity type doped to a first concentration;
   an emitter region of semiconductor material of the first conductivity type;
   a base region of semiconductor material of a second conductivity type opposite to the first conductivity type between the emitter region and the collector;
   the collector further including a lower doped drift region extending between the higher doped collector region and the base region, the drift region being of the first conductivity type and doped to a second concentration lower than the first concentration;
   a trench extending adjacent to the drift region; and
   a gate within the trench insulated from the drift region for controlling the drift region to be depleted of carriers in a voltage blocking mode of operation,
   wherein the gate in the trench includes an intrinsic semiconductor layer in the trench in contact with the highly doped collector region of first conductivity type, and a semiconductor layer of second conductivity type is provided adjacent to the intrinsic semiconductor layer and on the opposite side of the intrinsic semiconductor layer to the higher doped collector region.

14. A bipolar transistor structure, comprising:
   a collector including a higher doped collector region of semiconductor material of a first conductivity type doped to a first concentration;
   an emitter region of semiconductor material of the first conductivity type;
   a base region of semiconductor material of a second conductivity type opposite to the first conductivity type between the emitter region and the collector;
   the collector further including a lower doped drift region extending between and contacting the higher doped collector region and the base region, the drift region being of the first conductivity type and doped to a second concentration lower than the first concentration;
   a trench extending adjacent to the drift region; and
   a gate within the trench insulated from the drift region for controlling the drift region to be depleted of carriers in a voltage blocking mode of operation, wherein the gate extends from substantially adjacent with the boundary between the higher doped collector region and the drift region to the boundary between the drift region and the base region;
   wherein, in use with a reverse potential applied between the base and the highly doped collector regions, an electric field in the drift region is substantially uniform.

* * * * *